(12) United States Patent
Tsai et al.

(10) Patent No.: US 9,179,066 B1
(45) Date of Patent: Nov. 3, 2015

(54) TEMPERATURE COMPENSATION FOR SENSORS

(71) Applicant: Apple Inc., Cupertino, CA (US)

(72) Inventors: Richard H. Tsai, Cupertino, CA (US); Albert A. Ho, Mountain View, CA (US); Thomas M. Gregory, Cupertino, CA (US); Richard J. Topliss, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/292,867

(22) Filed: May 31, 2014

(51) Int. Cl.
| | |
|---|---|
| H04N 5/228 | (2006.01) |
| G03B 13/00 | (2006.01) |
| G03B 7/08 | (2014.01) |
| G01B 7/14 | (2006.01) |
| G01B 7/30 | (2006.01) |
| G01R 33/06 | (2006.01) |
| H01L 43/06 | (2006.01) |
| G01R 15/20 | (2006.01) |
| G01R 33/07 | (2006.01) |
| H04N 5/232 | (2006.01) |
| G05D 3/12 | (2006.01) |
| H02P 25/02 | (2006.01) |
| H02P 29/00 | (2006.01) |

(52) U.S. Cl.
CPC ............ *H04N 5/23251* (2013.01); *G05D 3/12* (2013.01); *H02P 25/028* (2013.01); *H02P 29/0094* (2013.01)

(58) Field of Classification Search
CPC ...... G01R 33/09; G01R 15/183; G01R 19/00; G01R 19/0092; G01R 21/133; G01R 22/10; G01R 31/007; G01R 31/2829; G01R 33/02; G01R 35/00; G01R 35/005; H04N 5/23203
USPC ......... 348/208.1–208.99, 222.1; 396/97, 231, 396/79–82; 324/207.2, 117 H
See application file for complete search history.

(56) References Cited

U.S. PATENT DOCUMENTS

| | | | | |
|---|---|---|---|---|
| 5,404,102 | A * | 4/1995 | Gokhale et al. | 324/252 |
| 5,492,273 | A * | 2/1996 | Shah | 236/44 A |
| 5,592,058 | A * | 1/1997 | Archer et al. | 318/400.09 |
| 8,362,764 | B2 * | 1/2013 | Peukert et al. | 324/251 |
| 2002/0105279 | A1 * | 8/2002 | Kimura | 315/169.3 |
| 2006/0197523 | A1 * | 9/2006 | Palecki et al. | 324/244 |
| 2009/0228224 | A1 * | 9/2009 | Spanier et al. | 702/60 |
| 2011/0196544 | A1 * | 8/2011 | Baarman et al. | 700/291 |
| 2012/0319473 | A1 * | 12/2012 | Tzivanopoulos et al. | 307/10.1 |
| 2013/0069579 | A1 * | 3/2013 | Uematsu et al. | 318/473 |
| 2013/0335100 | A1 * | 12/2013 | Boehm, Andre | 324/537 |
| 2014/0021947 | A1 * | 1/2014 | Gmajnic et al. | 324/252 |

(Continued)

*Primary Examiner* — Chia-Wei A Chen
(74) *Attorney, Agent, or Firm* — Robert C. Kowert; Meyertons, Hood, Kivlin, Kowert & Goetzel, P.C.

(57) ABSTRACT

In some embodiments, a plurality of expected values of a drive current corresponding to respective ones of a plurality of potential values of a Hall sensor output is determined. An actual value of the Hall sensor output is measured. An actual value of the drive current is measured. A potential value of the Hall sensor output corresponding to the actual value of the Hall sensor output is selected. The expected value of the drive current associated with the selected potential value of the Hall sensor output is compared to the actual value of the drive current. A value of the drive current is adjusted to reduce a difference between the expected value of the drive current associated with the selected potential value of the Hall sensor output to the actual value of the drive current.

20 Claims, 11 Drawing Sheets

(56) References Cited

U.S. PATENT DOCUMENTS

| | | |
|---|---|---|
| 2014/0070795 A1 | 3/2014 | Kolb et al. |
| 2014/0084912 A1 | 3/2014 | van Vroonhoven |
| 2014/0240698 A1* | 8/2014 | Wagner et al. ............... 356/218 |
| 2014/0336956 A1* | 11/2014 | Patti et al. .................. 702/50 |
| 2014/0347008 A1* | 11/2014 | Chae et al. .................. 320/108 |
| 2014/0354039 A1* | 12/2014 | Donadille .................... 307/9.1 |
| 2015/0002169 A1* | 1/2015 | Lu et al. ...................... 324/601 |

\* cited by examiner

TEMPERATURE COMPENSATION FOR SENSORS

BACKGROUND

1. Technical Field

This disclosure relates generally to compensation for the impact of heat on sensor readings when managing the motion of camera components.

2. Description of the Related Art

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis (referred to as the Z axis) of the camera to refocus the camera. In addition, high image quality is easier to achieve in small form factor cameras if lens motion along the optical axis is accompanied by minimal parasitic motion in the other degrees of freedom, for example on the X and Y axes orthogonal to the optical (Z) axis of the camera. Thus, some small form factor cameras that include autofocus mechanisms may also incorporate optical image stabilization (OIS) mechanisms that may sense and react to external excitation/disturbance by adjusting location of the optical lens on the X and/or Y axis in an attempt to compensate for unwanted motion of the lens.

SUMMARY OF EMBODIMENTS

In some embodiments, a plurality of expected values of a drive current corresponding to respective ones of a plurality of potential values of a Hall sensor output is determined. An actual value of the Hall sensor output is measured. An actual value of the drive current is measured. A potential value of the Hall sensor output corresponding to the actual value of the Hall sensor output is selected. The expected value of the drive current associated with the selected potential value of the Hall sensor output is compared to the actual value of the drive current. A value of the drive current is adjusted to reduce a difference between the expected value of the drive current associated with the selected potential value of the Hall sensor output to the actual value of the drive current.

Figure 1:
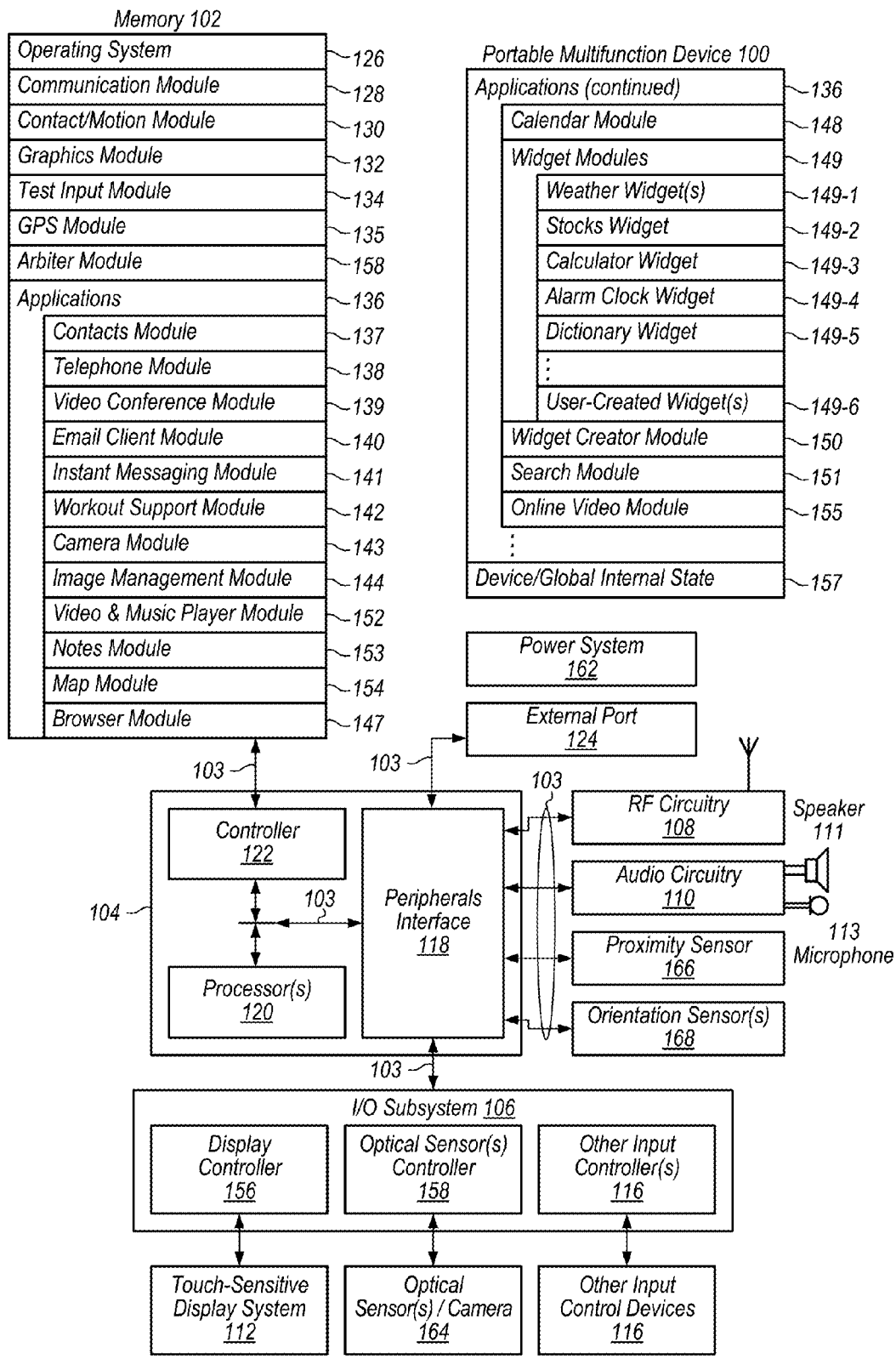
FIG. 1 illustrates a block diagram of a portable multifunction device with a camera in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware— for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Introduction to Thermal Compensation for Sensors

Some embodiments include camera equipment outfitted with controls to improve the position accuracy of a miniature actuation mechanism for a compact camera module. More specifically, in some embodiments, compact camera modules include actuators to deliver functions such as autofocus (AF) and optical image stabilization (OIS). One approach to delivering a very compact actuator for OIS is to use a Voice Coil Motor (VCM) arrangement. In this preferred arrangement, plural magnets are bonded to the moving body of the OIS actuator. For size and efficiency reason, these magnets are also used as part of the AF actuator housed inside the moving body of the OIS actuator. An arrangement of coils is mounted on the fixed body of the OIS actuator, along with an arrangement of Hall sensors.

For OIS, it is embodiments are frequently implemented in systems with two independent actuators moving the moving body of the OIS actuator in two orthogonal directions. Hence it is useful to employ at least two Hall sensors, to detect the position of the moving body of the OIS actuator in each of the directions. As current is applied to the OIS coils, the magnetic field generated interacts with the magnetic field of the magnets to generate forces that move the moving body in the desired manner. As the magnet moves, this changes the magnetic field through the Hall sensor, which in turn alters the voltage across the sense terminals of the Hall sensor.

Some embodiments allow the Hall sensor output voltage to be very well correlated to the position of the moving body, such that the Hall sensor output can be used as a measure of position, and be used to feedback the position, and allow more accurate positioning. Using a VCM, in some embodiments the forces generated are substantially linear with applied current, and hence assuming the moving body is suspended on the fixed body using substantially linear springs, the position of the moving body is substantially proportional to the applied VCM current.

Some embodiments allow the actuator to maintain positional accuracy over a wide temperature range, providing compensation for several factors that degrade positional accuracy as the temperature changes. In some embodiments, the dominant factor that degrades positional accuracy is corrected to first order. In some embodiments this algorithm does not require a factory calibration of individual actuators at plural temperatures to achieve this first order correction. Various factors exist that degrade positional performance. For example, the Hall sensor output voltage may change by approximately 0.5% if the temperature changes by 40 C. However, it is found that a camera, the Hall sensor voltage changes are sometimes nearer 5%, meaning that the changes are not attributable to the Hall sensor component. It is found that the dominant factor is the change in the magnetic field produced by the magnet, due to the reversible demagnetization effect. Some embodiments provide compensation for changes in the magnetic field produced by the magnet by using information about the sensitivity of the VCM actuator itself, and the Hall sensor.

As discussed above, when operating the actuator at different temperatures a number of factors cause the VCM sensitivity and the Hall sensor gain to drift. However, the dominant effect is the change in magnetic field from the magnet. Some embodiments make use of the calibration data of the VCM and Hall sensors at the time of manufacture to compensate for the change in magnetic field strength. The algorithm works by detecting that the current required to achieve a given Hall sensor reading is not what is expected based on the factory calibration (when appropriately corrected for factors such as camera orientation and any other correction algorithms to correct for other effects). The correction algorithm is then run. For the closed loop operation case, the algorithm determines the difference in the actual applied current from the expectation based on previous calibration and correction routines. Then the algorithm adjusts the demanded Hall sensor position so that the applied drive current is halfway between the expected current, and the actual current at the original demanded Hall sensor demand. As can be seen from embodiments, the current halfway between the actual current and the expected current would be a current 5% higher than the expected current, which is exactly the value required to compensate for the magnetic field change (assuming this is the dominant effect).

Some embodiments include a method for performing temperature compensation. In some embodiments, the method includes determining a plurality of expected values of a drive current corresponding to respective ones of a plurality of potential values of a Hall sensor output, measuring an actual value of the Hall sensor output, measuring an actual value of the drive current, selecting a potential value of the Hall sensor output corresponding to the actual value of the Hall sensor output, comparing the expected value of the drive current associated with the selected potential value of the Hall sensor output to the actual value of the drive current, and adjusting a value of the drive current to reduce a difference between the expected value of the drive current associated with the selected potential value of the Hall sensor output to the actual value of the drive current.

In some embodiments, determining a plurality of expected values of a drive current corresponding to respective ones of a plurality of potential values of a Hall sensor output further includes performing a factory calibration that includes characterization at only one temperature of an open loop sensitivity of a voice coil motor actuator and the Hall sensor output for plural positions of the voice coil motor actuator. In some embodiments, adjusting a value of the drive current to reduce a difference between the expected value of the drive current associated with the selected potential value of the Hall sensor output to the actual value of the drive current further includes adjusting a value of the drive current based on the plurality of expected values of the drive current to halve a difference between the expected value of the drive current associated with the selected potential value of the Hall sensor output to the actual value of the drive current.

In some embodiments, determining a plurality of expected values of a drive current corresponding to respective ones of a plurality of potential values of a Hall sensor output further includes characterizing an open loop sensitivity of a voice coil motor actuator and the Hall sensor output for plural positions of the voice coil motor actuator. In some embodiments, adjusting a value of the drive current to reduce a difference between the expected value of the drive current associated with the selected potential value of the Hall sensor output to the actual value of the drive current further includes adjusting a value of the drive current based at least in part on the plurality of expected values of the drive current.

In some embodiments, adjusting a value of the drive current to reduce a difference between the expected value of the drive current associated with the selected potential value of the Hall sensor output to the actual value of the drive current further includes providing temperature compensation by adjusting a value of the drive current in an actuator providing optical image stabilization based at least in part on the plurality of expected values of the drive current.

In some embodiments, adjusting a value of the drive current to reduce a difference between the expected value of the drive current associated with the selected potential value of the Hall sensor output to the actual value of the drive current further includes adjusting a value of the drive current based at least in part on the plurality of expected values of the drive current.

Some embodiments include a non-transitory computer-readable storage medium storing program instructions. In some embodiments, the program instructions are computer-executable to implement determining a plurality of expected values of a drive current corresponding to respective ones of a plurality of potential values of a Hall sensor output, measuring an actual value of the Hall sensor output, measuring an actual value of the drive current, selecting a potential value of the Hall sensor output corresponding to the actual value of the Hall sensor output, comparing the expected value of the drive current associated with the selected potential value of the Hall sensor output to the actual value of the drive current, and adjusting a value of the drive current to reduce a difference between the expected value of the drive current associated with the selected potential value of the Hall sensor output to the actual value of the drive current.

In some embodiments, the program instructions computer-executable to implement determining a plurality of expected values of a drive current corresponding to respective ones of a plurality of potential values of a Hall sensor output further include program instructions computer-executable to implement performing a factory calibration that includes characterization at only one temperature of an open loop sensitivity of a voice coil motor actuator and the Hall sensor output for plural positions of the voice coil motor actuator.

In some embodiments, the program instructions computer-executable to implement adjusting a value of the drive current to reduce a difference between the expected value of the drive current associated with the selected potential value of the Hall sensor output to the actual value of the drive current further include program instructions computer-executable to implement adjusting a value of the drive current based on the plurality of expected values of the drive current to halve a difference between the expected value of the drive current associated with the selected potential value of the Hall sensor output to the actual value of the drive current.

In some embodiments, the program instructions computer-executable to implement determining a plurality of expected values of a drive current corresponding to respective ones of a plurality of potential values of a Hall sensor output further include program instructions computer-executable to implement characterizing an open loop sensitivity of a voice coil motor actuator and the Hall sensor output for plural positions of the voice coil motor actuator.

In some embodiments, the program instructions computer-executable to implement adjusting a value of the drive current to reduce a difference between the expected value of the drive current associated with the selected potential value of the Hall sensor output to the actual value of the drive current further include program instructions computer-executable to implement adjusting a value of the drive current based at least in part on the plurality of expected values of the drive current.

In some embodiments, the program instructions computer-executable to implement adjusting a value of the drive current to reduce a difference between the expected value of the drive current associated with the selected potential value of the Hall sensor output to the actual value of the drive current further include program instructions computer-executable to implement providing temperature compensation by adjusting a value of the drive current in an actuator providing optical image stabilization based at least in part on the plurality of expected values of the drive current.

In some embodiments, the program instructions computer-executable to implement adjusting a value of the drive current to reduce a difference between the expected value of the drive current associated with the selected potential value of the Hall sensor output to the actual value of the drive current further include program instructions computer-executable to implement adjusting a value of the drive current based at least in part on the plurality of expected values of the drive current.

Some embodiments further include an apparatus for controlling the motion of a camera component. In some embodiments, the apparatus includes an actuator module comprising a plurality of magnets, sensors for measuring a magnetic field, one or more processors, and one or more memories. In some embodiments, the memories store instructions executable on the one or more processors to perform determining a plurality of expected values of a drive current corresponding to respective ones of a plurality of potential values of a Hall sensor output, measuring an actual value of the Hall sensor output, measuring an actual value of the drive current, selecting a potential value of the Hall sensor output corresponding to the actual value of the Hall sensor output, comparing the expected value of the drive current associated with the selected potential value of the Hall sensor output to the actual value of the drive current, and adjusting a value of the drive current to reduce a difference between the expected value of the drive current associated with the selected potential value of the Hall sensor output to the actual value of the drive current.

In some embodiments, the instructions executable on the one or more processors to perform determining a plurality of expected values of a drive current corresponding to respective ones of a plurality of potential values of a Hall sensor output further include instructions executable on the one or more processors to perform performing a factory calibration that includes characterization at only one temperature of an open loop sensitivity of a voice coil motor actuator and the Hall sensor output for plural positions of the voice coil motor actuator.

In some embodiments, the instructions executable on the one or more processors to perform adjusting a value of the drive current to reduce a difference between the expected value of the drive current associated with the selected potential value of the Hall sensor output to the actual value of the drive current further include instructions executable on the one or more processors to perform adjusting a value of the drive current based on the plurality of expected values of the drive current to halve a difference between the expected value of the drive current associated with the selected potential value of the Hall sensor output to the actual value of the drive current.

In some embodiments, the instructions executable on the one or more processors to perform determining a plurality of expected values of a drive current corresponding to respective ones of a plurality of potential values of a Hall sensor output further include instructions executable on the one or more processors to perform characterizing an open loop sensitivity of a voice coil motor actuator and the Hall sensor output for plural positions of the voice coil motor actuator.

In some embodiments, the instructions executable on the one or more processors to perform adjusting a value of the drive current to reduce a difference between the expected value of the drive current associated with the selected potential value of the Hall sensor output to the actual value of the drive current further include instructions executable on the one or more processors to perform adjusting a value of the drive current based at least in part on the plurality of expected values of the drive current.

In some embodiments, the instructions executable on the one or more processors to perform adjusting a value of the drive current to reduce a difference between the expected value of the drive current associated with the selected potential value of the Hall sensor output to the actual value of the drive current further include instructions executable on the one or more processors to perform providing temperature compensation by adjusting a value of the drive current in an actuator providing optical image stabilization based at least in part on the plurality of expected values of the drive current.

Some embodiments are used with an actuator module for controlling the position of a lens relative to an image sensor along three orthogonal axes, and a focusing mechanism for moving a lens along an optical axis. In some embodiments, the mechanism is suspended on a plurality of wires, each substantially parallel to an optical axis, the wires capable of bending deformations that allow the focusing mechanism to move in linear directions orthogonal to the optical axis. The actuator module may be referred to as an optical image stabilization (OIS) voice coil motor (VCM) actuator. The actuator module may, for example, be used in a miniature or small form factor camera suitable for small, mobile multipurpose devices such as cell phones, smartphones, and pad or tablet devices.

Multifunction Device Examples

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Embodiments of electronic devices, user interfaces for such devices, and associated processes for using such devices are described. In some embodiments, the device is a portable communications device, such as a mobile telephone, that also contains other functions, such as PDA and/or music player functions. Example embodiments of portable multifunction devices include, without limitation, the iPhone®, iPod Touch®, and iPad® devices from Apple Inc. of Cupertino, Calif. Other portable electronic devices, such as laptops, cameras, cell phones, or tablet computers, may also be used. It should also be understood that, in some embodiments, the device is not a portable communications device, but is a desktop computer with a camera. In some embodiments, the device is a gaming computer with orientation sensors (e.g., orientation sensors in a gaming controller). In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Attention is now directed toward embodiments of portable devices with cameras. FIG. 1 is a block diagram illustrating portable multifunction device 100 with camera 164 in accordance with some embodiments. Camera 164 is sometimes called an "optical sensor" for convenience, and may also be known as or called an optical sensor system. Device 100 may include memory 102 (which may include one or more computer readable storage mediums), memory controller 122, one or more processing units (CPU's) 120, peripherals interface 118, RF circuitry 108, audio circuitry 110, speaker 111, touch-sensitive display system 112, microphone 113, input/output (I/O) subsystem 106, other input or control devices 116, and external port 124. Device 100 may include one or more optical sensors 164. These components may communicate over one or more communication buses or signal lines 103.

It should be appreciated that device 100 is only one example of a portable multifunction device, and that device 100 may have more or fewer components than shown, may combine two or more components, or may have a different configuration or arrangement of the components. The various components shown in FIG. 28 may be implemented in hardware, software, or a combination of hardware and software, including one or more signal processing and/or application specific integrated circuits.

Memory 102 may include high-speed random access memory and may also include non-volatile memory, such as one or more magnetic disk storage devices, flash memory devices, or other non-volatile solid-state memory devices. Access to memory 102 by other components of device 100, such as CPU 120 and the peripherals interface 118, may be controlled by memory controller 122.

Peripherals interface 118 can be used to couple input and output peripherals of the device to CPU 120 and memory 102. The one or more processors 120 run or execute various software programs and/or sets of instructions stored in memory 102 to perform various functions for device 100 and to process data.

In some embodiments, peripherals interface 118, CPU 120, and memory controller 122 may be implemented on a single chip, such as chip 104. In some other embodiments, they may be implemented on separate chips.

RF (radio frequency) circuitry 108 receives and sends RF signals, also called electromagnetic signals. RF circuitry 108 converts electrical signals to/from electromagnetic signals and communicates with communications networks and other communications devices via the electromagnetic signals. RF circuitry 108 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 108 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 110, speaker 111, and microphone 113 provide an audio interface between a user and device 100. Audio circuitry 110 receives audio data from peripherals interface 118, converts the audio data to an electrical signal, and transmits the electrical signal to speaker 111. Speaker 111 converts the electrical signal to human-audible sound waves. Audio circuitry 110 also receives electrical signals converted by microphone 113 from sound waves. Audio circuitry 110 converts the electrical signal to audio data and transmits the audio data to peripherals interface 118 for processing. Audio data may be retrieved from and/or transmitted to memory 102 and/or RF circuitry 108 by peripherals interface 118. In some embodiments, audio circuitry 110 also includes a headset jack (e.g., 212, FIG. 2). The headset jack provides an interface between audio circuitry 110 and removable audio input/output peripherals, such as output-only headphones or a headset with both output (e.g., a headphone for one or both ears) and input (e.g., a microphone).

I/O subsystem 106 couples input/output peripherals on device 100, such as touch screen 112 and other input control devices 116, to peripherals interface 118. I/O subsystem 106 may include display controller 156 and one or more input controllers 160 for other input or control devices. The one or more input controllers 160 receive/send electrical signals from/to other input or control devices 116. The other input control devices 116 may include physical buttons (e.g., push buttons, rocker buttons, etc.), dials, slider switches, joysticks, click wheels, and so forth. In some alternate embodiments, input controller(s) 160 may be coupled to any (or none) of the following: a keyboard, infrared port, USB port, and a pointer device such as a mouse. The one or more buttons (e.g., 208, FIG. 2) may include an up/down button for volume control of speaker 111 and/or microphone 113. The one or more buttons may include a push button (e.g., 206, FIG. 2).

Touch-sensitive display 112 provides an input interface and an output interface between the device and a user. Display controller 156 receives and/or sends electrical signals from/to touch screen 112. Touch screen 112 displays visual output to the user. The visual output may include graphics, text, icons, video, and any combination thereof (collectively termed "graphics"). In some embodiments, some or all of the visual output may correspond to user-interface objects.

Touch screen 112 has a touch-sensitive surface, sensor or set of sensors that accepts input from the user based on haptic and/or tactile contact. Touch screen 112 and display controller 156 (along with any associated modules and/or sets of instructions in memory 102) detect contact (and any movement or breaking of the contact) on touch screen 112 and converts the detected contact into interaction with user-interface objects (e.g., one or more soft keys, icons, web pages or images) that are displayed on touch screen 112. In an example embodiment, a point of contact between touch screen 112 and the user corresponds to a finger of the user.

Touch screen 112 may use LCD (liquid crystal display) technology, LPD (light emitting polymer display) technology, or LED (light emitting diode) technology, although other display technologies may be used in other embodiments. Touch screen 112 and display controller 156 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 112. In an example embodiment, projected mutual capacitance sensing technology is used, such as that found in the iPhone®, iPod Touch®, and iPad® from Apple Inc. of Cupertino, Calif.

Touch screen 112 may have a video resolution in excess of 100 dpi. In some embodiments, the touch screen has a video resolution of approximately 160 dpi. The user may make contact with touch screen 112 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 100 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 112 or an extension of the touch-sensitive surface formed by the touch screen.

Device 100 also includes power system 162 for powering the various components. Power system 162 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 100 may also include one or more optical sensors or cameras 164. FIG. 28 shows an optical sensor coupled to optical sensor controller 158 in I/O subsystem 106. Optical sensor 164 may include charge-coupled device (CCD) or complementary metal-oxide semiconductor (CMOS) phototransistors. Optical sensor 164 receives light from the environment, projected through one or more lens, and converts the light to data representing an image. In conjunction with imaging module 143 (also called a camera module), optical sensor 164 may capture still images or video. In some embodiments, an optical sensor is located on the back of device 100, opposite touch screen display 112 on the front of the device, so that the touch screen display may be used as a viewfinder for still and/or video image acquisition. In some embodiments, another optical sensor is located on the front of the device so that the user's image may be obtained for videoconferencing while the user views the other video conference participants on the touch screen display.

Device 100 may also include one or more proximity sensors 166. FIG. 28 shows proximity sensor 166 coupled to peripherals interface 118. Alternately, proximity sensor 166 may be coupled to input controller 160 in I/O subsystem 106. In some embodiments, the proximity sensor turns off and disables touch screen 112 when the multifunction device is placed near the user's ear (e.g., when the user is making a phone call).

Device 100 includes one or more orientation sensors 168. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 100. In some embodiments, the one or more orientation sensors include any combination of orientation/rotation sensors. FIG. 28 shows the one or more orientation sensors 168 coupled to peripherals interface 118. Alternately, the one or more orientation sensors 168 may be coupled to an input controller 160 in I/O subsystem 106. In some embodiments, information is displayed on the touch screen display in a portrait view or a landscape view based on an analysis of data received from the one or more orientation sensors.

Figure 3:
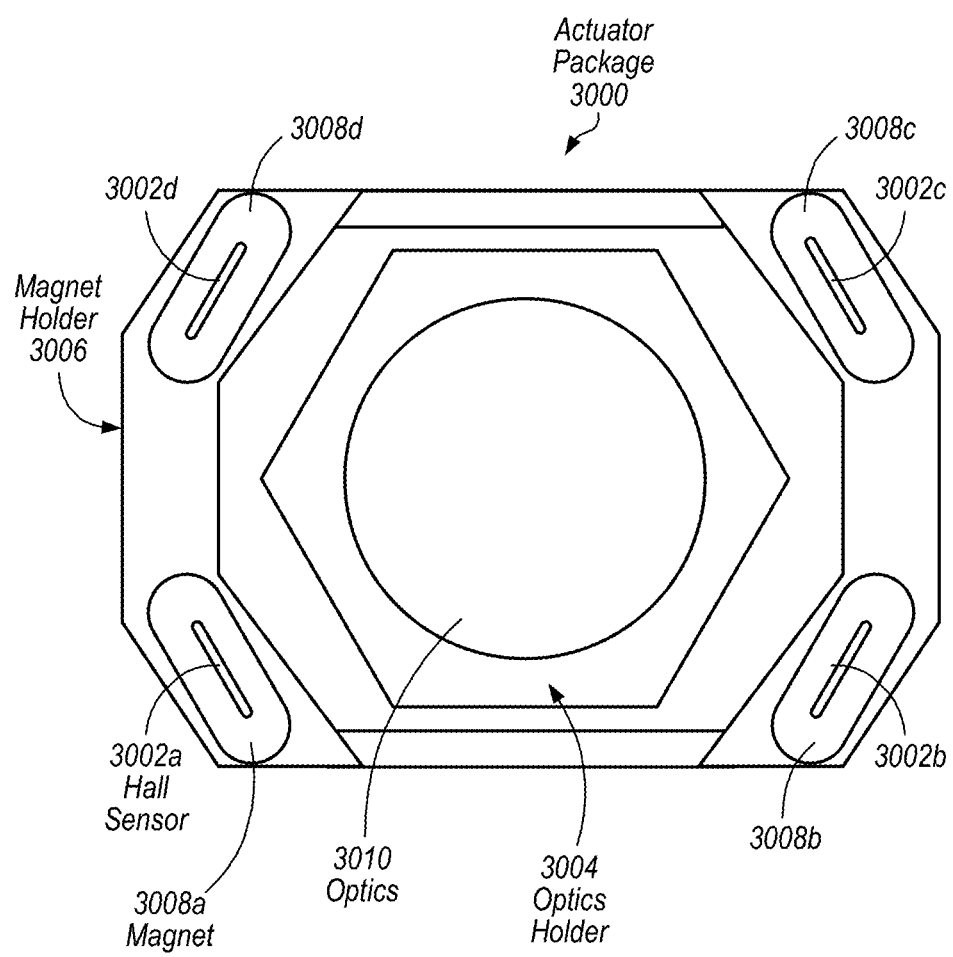
FIG. 3 illustrates a top view of an example embodiment of an actuator module or assembly that may, for example, be used in small form factor cameras, according to at least some embodiments.

In some embodiments, the software components stored in memory 102 include operating system 126, communication module (or set of instructions) 128, contact/motion module (or set of instructions) 130, graphics module (or set of instructions) 132, text input module (or set of instructions) 134, Global Positioning System (GPS) module (or set of instructions) 135, arbiter module 157 and applications (or sets of instructions) 136. Furthermore, in some embodiments memory 102 stores device/global internal state 157, as shown in FIGS. 1A and 3. Device/global internal state 157 includes one or more of: active application state, indicating which applications, if any, are currently active; display state, indicating what applications, views or other information occupy various regions of touch screen display 112; sensor state, including information obtained from the device's various sensors and input control devices 116; and location information concerning the device's location and/or attitude.

Operating system 126 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 128 facilitates communication with other devices over one or more external ports 124 and also includes various software components for handling data received by RF circuitry 108 and/or external port 124. External port 124 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector that is the same as, or similar to and/or compatible with the 30-pin connector used on iPod (trademark of Apple Inc.) devices.

Contact/motion module 130 may detect contact with touch screen 112 (in conjunction with display controller 156) and other touch sensitive devices (e.g., a touchpad or physical click wheel). Contact/motion module 130 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 130 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 130 and display controller 156 detect contact on a touchpad.

Contact/motion module 130 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 132 includes various known software components for rendering and displaying graphics on touch screen 112 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 132 stores data representing graphics to be used. Each graphic may be assigned a corresponding code. Graphics module 132 receives, from applications etc., one or more codes specifying graphics to be displayed along with, if necessary, coordinate data and other graphic property data, and then generates screen image data to output to display controller 156.

Text input module 134, which may be a component of graphics module 132, provides soft keyboards for entering text in various applications (e.g., contacts 137, e-mail 140, IM 141, browser 147, and any other application that needs text input).

GPS module 135 determines the location of the device and provides this information for use in various applications (e.g., to telephone 138 for use in location-based dialing, to camera 143 as picture/video metadata, and to applications that provide location-based services such as weather widgets, local yellow page widgets, and map/navigation widgets).

Applications 136 may include the following modules (or sets of instructions), or a subset or superset thereof:
  contacts module 137 (sometimes called an address book or contact list);
  telephone module 138;
  video conferencing module 139;
  e-mail client module 140;
  instant messaging (IM) module 141;
  workout support module 142;
  camera module 143 for still and/or video images;
  image management module 144;
  browser module 147;
  calendar module 148;
  widget modules 149, which may include one or more of:
    weather widget 149-1, stocks widget 149-2, calculator widget 149-3, alarm clock widget 149-4, dictionary widget 149-5, and other widgets obtained by the user, as well as user-created widgets 149-6;
  widget creator module 150 for making user-created widgets 149-6;
  search module 151;
  video and music player module 152, which may be made up of a video player
  module and a music player module;
  notes module 153;
  map module 154; and/or
  online video module 155.

Examples of other applications 136 that may be stored in memory 102 include other word processing applications, other image editing applications, drawing applications, presentation applications, JAVA-enabled applications, encryption, digital rights management, voice recognition, and voice replication.

In conjunction with touch screen 112, display controller 156, contact module 130, graphics module 132, and text input module 134, contacts module 137 may be used to manage an address book or contact list (e.g., stored in application internal state 192 of contacts module 137 in memory 102 or memory 370), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 138, video conference 139, e-mail 140, or IM 141; and so forth.

In conjunction with RF circuitry 108, audio circuitry 110, speaker 111, microphone 113, touch screen 112, display controller 156, contact module 130, graphics module 132, and text input module 134, telephone module 138 may be used to enter a sequence of characters corresponding to a telephone number, access one or more telephone numbers in address book 137, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 108, audio circuitry 110, speaker 111, microphone 113, touch screen 112, display controller 156, optical sensor 164, optical sensor controller 158, contact module 130, graphics module 132, text input module 134, contact list 137, and telephone module 138, videoconferencing module 139 includes executable instructions to initiate, conduct, and terminate a video conference between a user and one or more other participants in accordance with user instructions.

In conjunction with RF circuitry 108, touch screen 112, display controller 156, contact module 130, graphics module 132, and text input module 134, e-mail client module 140 includes executable instructions to create, send, receive, and manage e-mail in response to user instructions. In conjunction with image management module 144, e-mail client module 140 makes it very easy to create and send e-mails with still or video images taken with camera module 143.

In conjunction with RF circuitry 108, touch screen 112, display controller 156, contact module 130, graphics module 132, and text input module 134, the instant messaging module 141 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 108, touch screen 112, display controller 156, contact module 130, graphics module 132, text input module 134, GPS module 135, map module 154, and music player module 146, workout support module 142 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 112, display controller 156, optical sensor(s) 164, optical sensor controller 158, contact module 130, graphics module 132, and image management module 144, camera module 143 includes executable instructions to capture still images or video (including a video stream) and store them into memory 102, modify characteristics of a still image or video, or delete a still image or video from memory 102.

In conjunction with touch screen 112, display controller 156, contact module 130, graphics module 132, text input module 134, and camera module 143, image management module 144 includes executable instructions to arrange, modify (e.g., edit), or otherwise manipulate, label, delete, present (e.g., in a digital slide show or album), and store still and/or video images.

In conjunction with RF circuitry 108, touch screen 112, display system controller 156, contact module 130, graphics module 132, and text input module 134, browser module 147 includes executable instructions to browse the Internet in accordance with user instructions, including searching, linking to, receiving, and displaying web pages or portions thereof, as well as attachments and other files linked to web pages.

In conjunction with RF circuitry 108, touch screen 112, display system controller 156, contact module 130, graphics module 132, text input module 134, e-mail client module 140, and browser module 147, calendar module 148 includes executable instructions to create, display, modify, and store calendars and data associated with calendars (e.g., calendar entries, to do lists, etc.) in accordance with user instructions.

In conjunction with RF circuitry 108, touch screen 112, display system controller 156, contact module 130, graphics module 132, text input module 134, and browser module 147, widget modules 149 are mini-applications that may be downloaded and used by a user (e.g., weather widget 149-1, stocks widget 149-2, calculator widget 1493, alarm clock widget 149-4, and dictionary widget 149-5) or created by the user (e.g., user-created widget 149-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 108, touch screen 112, display system controller 156, contact module 130, graphics module 132, text input module 134, and browser module 147, the widget creator module 150 may be used by a user to create widgets (e.g., turning a user-specified portion of a web page into a widget).

In conjunction with touch screen 112, display system controller 156, contact module 130, graphics module 132, and text input module 134, search module 151 includes executable instructions to search for text, music, sound, image, video, and/or other files in memory 102 that match one or more search criteria (e.g., one or more user-specified search terms) in accordance with user instructions.

In conjunction with touch screen 112, display system controller 156, contact module 130, graphics module 132, audio circuitry 110, speaker 111, RF circuitry 108, and browser module 147, video and music player module 152 includes executable instructions that allow the user to download and play back recorded music and other sound files stored in one or more file formats, such as MP3 or AAC files, and executable instructions to display, present or otherwise play back videos (e.g., on touch screen 112 or on an external, connected display via external port 124). In some embodiments, device 100 may include the functionality of an MP3 player, such as an iPod (trademark of Apple Inc.).

In conjunction with touch screen 112, display controller 156, contact module 130, graphics module 132, and text input module 134, notes module 153 includes executable instructions to create and manage notes, to do lists, and the like in accordance with user instructions.

In conjunction with RF circuitry 108, touch screen 112, display system controller 156, contact module 130, graphics module 132, text input module 134, GPS module 135, and browser module 147, map module 154 may be used to receive, display, modify, and store maps and data associated with maps (e.g., driving directions; data on stores and other points of interest at or near a particular location; and other location-based data) in accordance with user instructions.

In conjunction with touch screen 112, display system controller 156, contact module 130, graphics module 132, audio circuitry 110, speaker 111, RF circuitry 108, text input module 134, e-mail client module 140, and browser module 147, online video module 155 includes instructions that allow the user to access, browse, receive (e.g., by streaming and/or download), play back (e.g., on the touch screen or on an external, connected display via external port 124), send an e-mail with a link to a particular online video, and otherwise manage online videos in one or more file formats, such as H.264. In some embodiments, instant messaging module 141, rather than e-mail client module 140, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 102 may store a subset of the modules and data structures identified above. Furthermore, memory 102 may store additional modules and data structures not described above.

In some embodiments, device 100 is a device where operation of a predefined set of functions on the device is performed exclusively through a touch screen and/or a touchpad. By using a touch screen and/or a touchpad as the primary input control device for operation of device 100, the number of physical input control devices (such as push buttons, dials, and the like) on device 100 may be reduced.

The predefined set of functions that may be performed exclusively through a touch screen and/or a touchpad include navigation between user interfaces. In some embodiments, the touchpad, when touched by the user, navigates device 100 to a main, home, or root menu from any user interface that may be displayed on device 100. In such embodiments, the touchpad may be referred to as a "menu button." In some other embodiments, the menu button may be a physical push button or other physical input control device instead of a touchpad.

Figure 2:
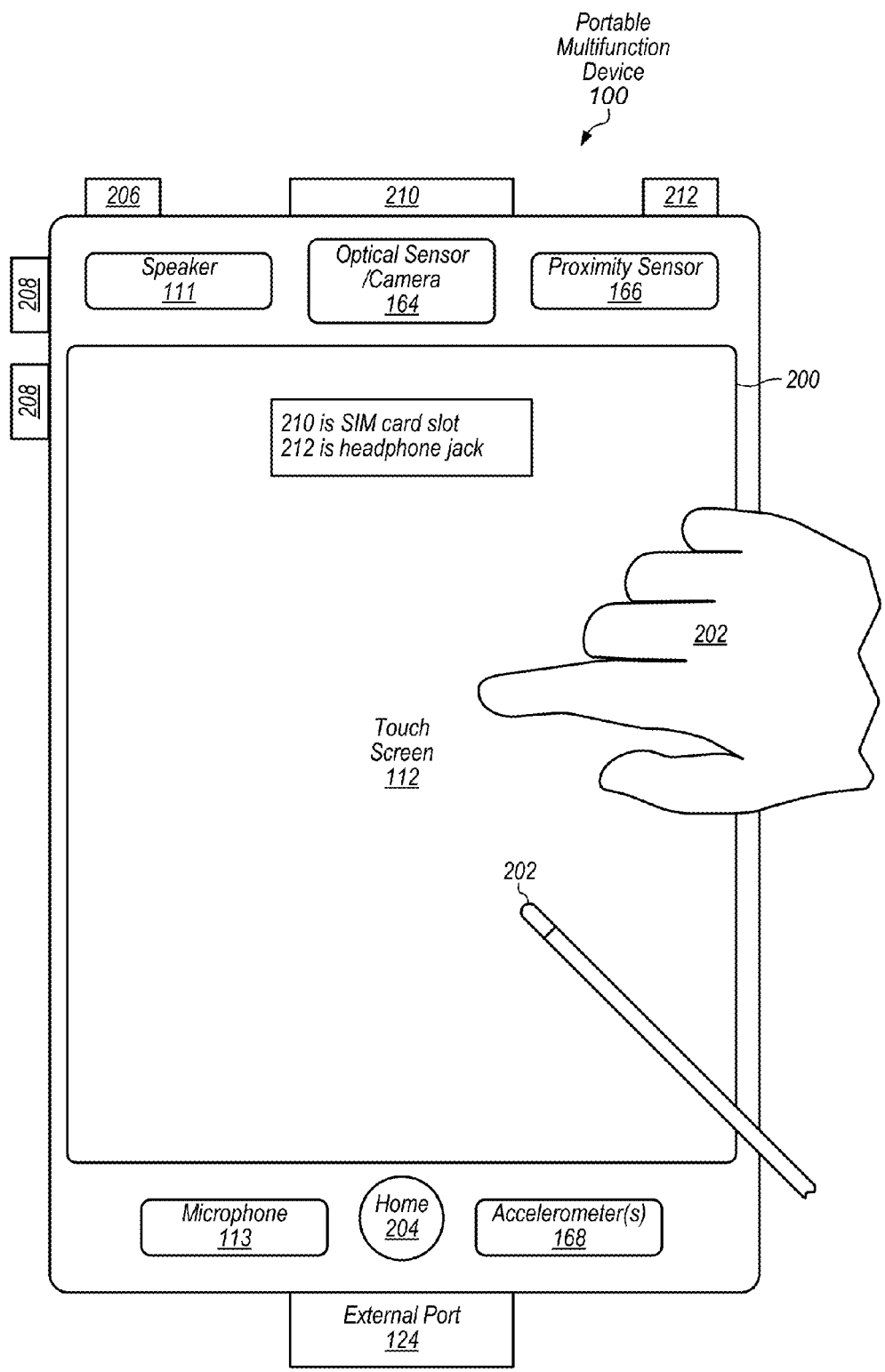
FIG. 2 depicts a portable multifunction device having a camera in accordance with some embodiments.

FIG. 2 illustrates a portable multifunction device 100 having a touch screen 112 in accordance with some embodiments. The touch screen may display one or more graphics within user interface (UI) 200. In this embodiment, as well as others described below, a user may select one or more of the graphics by making a gesture on the graphics, for example, with one or more fingers 202 (not drawn to scale in the figure) or one or more styluses 203 (not drawn to scale in the figure).

Device 100 may also include one or more physical buttons, such as "home" or menu button 204. As described previously, menu button 204 may be used to navigate to any application 136 in a set of applications that may be executed on device 100. Alternatively, in some embodiments, the menu button is implemented as a soft key in a GUI displayed on touch screen 112.

In one embodiment, device 100 includes touch screen 112, menu button 204, push button 206 for powering the device on/off and locking the device, volume adjustment button(s) 208, Subscriber Identity Module (SIM) card slot 210, head set jack 212, and docking/charging external port 124. Push button 206 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also may accept verbal input for activation or deactivation of some functions through microphone 113.

It should be noted that, although many of the examples herein are given with reference to optical sensor/camera 164 (on the front of a device), a rear-facing camera or optical sensor that is pointed opposite from the display may be used instead of or in addition to an optical sensor/camera 164 on the front of a device.

Figure 4:
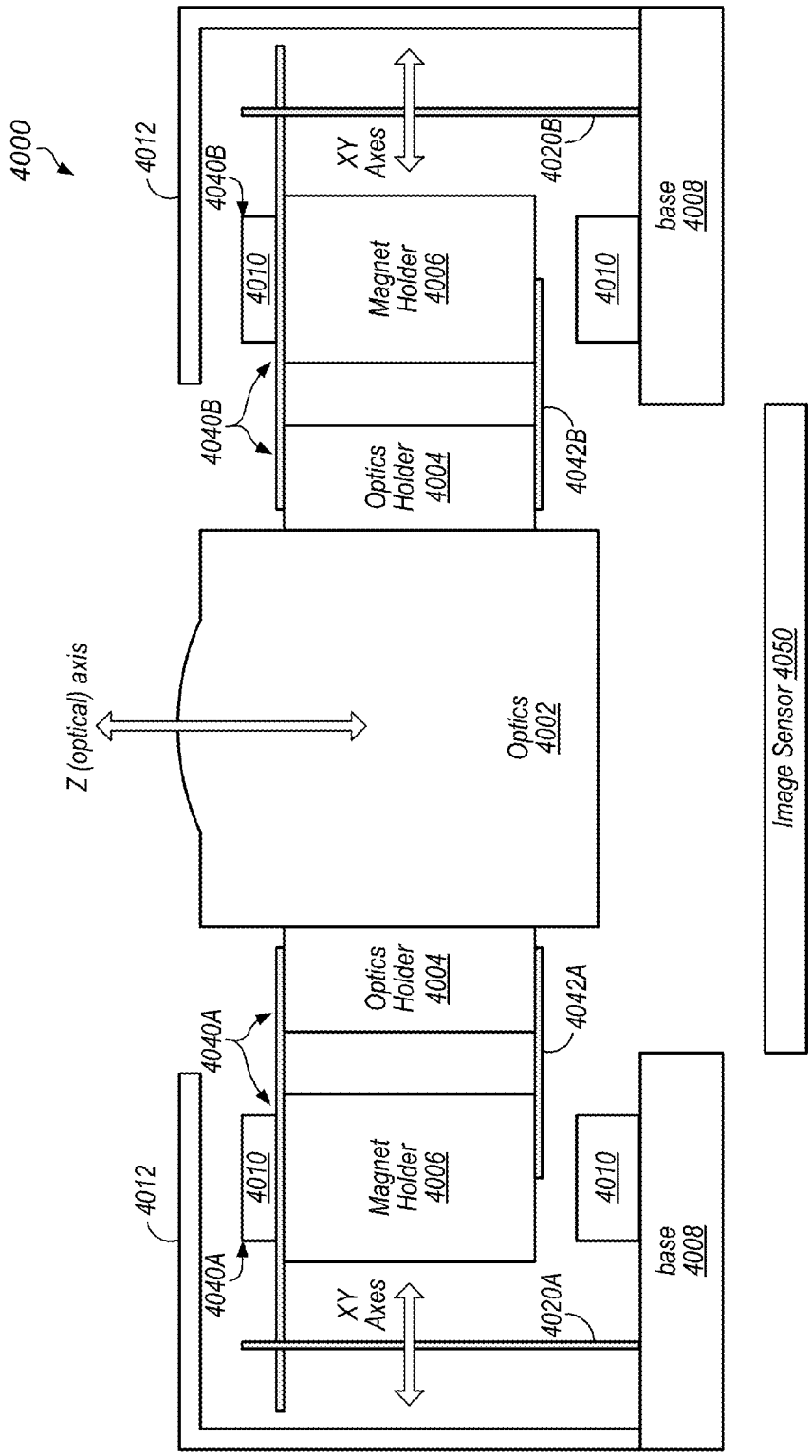
FIG. 4 depicts a side view of an example embodiment of an actuator module or assembly that may, for example, be used in small form factor cameras, according to at least some embodiments.

FIGS. 3-4 illustrate embodiments of an example actuator assembly in which embodiments of temperature compensation as described herein may be applied. FIG. 3 illustrates a top view of an example embodiment of an actuator module or assembly that may, for example, be used in small form factor cameras, according to at least some embodiments. An optics assembly 3010 is held in an optics holder 3004 of an actuator package 3000. A magnet holder 3006 holds magnets 3008*a*-3008*d* and hall sensors 3002*a*-3002*d*.

FIG. 4 depicts a side view of an example embodiment of an actuator module or assembly that may, for example, be used in small form factor cameras, according to at least some embodiments. In particular, embodiments of temperature compensation may be applied within an actuator package or assembly 4000 as illustrated in FIGS. 3 and 4 to stabilize and increase control performance of an optics assembly 4000 suspended on wires 4020 within an actuator package 3000 as shown in FIG. 3. Details of example embodiments, implementations, and methods of operations of optical image stabilization actuators and associated sensors such as the example actuator package 3000 shown in these FIGs are discussed below with respect to FIGS. 5-10.

Each magnet is poled so as to generate a magnetic field, the useful component of which for the autofocus function is orthogonal to the optical axis of the camera/lens, and orthogonal to the plane of each magnet proximate to the autofocus coil, and where the field for all four magnets are all either directed towards the autofocus coil, or away from it, so that the Lorentz forces from all four magnets act in the same direction along the optical axis.

FIG. 4 shows a side view of an example embodiment of an actuator module or assembly 4000 that may, for example, be used in small form factor cameras, according to at least some embodiments, and in which embodiments of a temperature compensation may be applied. As shown in FIG. 4, an actuator package 4000 may include a base assembly 4008, an optics assembly 4002, and a cover 4012. Base assembly 4008 may include one or more of, but is not limited to, a base 4008, one or more magnet displacement sensors (Hall sensors) 4010, and suspension wires 3020. In at least some embodiments, there are four suspension wires 4020. An optics assembly 4002 may be suspended on the base assembly 4008 by suspension of the upper springs 4040 of optics assembly 4000 on the suspension wires 4020. Optics assembly 4000 may include one or more of, but is not limited to, optics 4002, optics holder 4004, magnet holder(s) 4006, upper spring(s) 4040, and lower spring(s) 4042. The upper and lower spring(s) may be collectively referred to herein as optics springs. In optics assembly 4000, an optics 4002 component (e.g., a lens or lens assembly) may be screwed, mounted or otherwise held in or by an optics holder 4004. In at least some embodiments, the optics 4002/optics holder 4004 assembly may be suspended from or attached to the magnet holder 4006 by upper spring(s) 4040, and lower spring(s) 4042. Note that upper spring(s) 4040 and lower spring(s) 4042 are flexible to allow the optics assembly 4000 a range of motion along the Z (optical) axis for optical focusing, wires 4020 are flexible to allow a range of motion on the XY plane orthogonal to the optical axis for optical image stabilization.

Note that, in some embodiments, an optics assembly 4000 of an actuator assembly may not include magnets and magnet holder(s) 4006, but may include a yoke or other structure 4006 that may be used to help support the optics assembly on suspension wires 4020 via upper sprigs 4030. However in some embodiments, optics assembly 4000 may not include elements 4006. In general, other embodiments of an optics assembly 4000 may include fewer or more components than the example optics assembly 4000 shown in FIG. 4. Also note that, while embodiments show the optics assembly 4000 suspended on wires 4020, other mechanisms may be used to suspend an optics assembly 4000 in other embodiments.

The autofocus yoke (e.g., magnet holder(s) 4006) acts as the support chassis structure for the autofocus mechanism of actuator 4000. The lens carrier (optics holder 4004) is suspended on the autofocus yoke by an upper autofocus (AF) spring 4040 and a lower optics spring 4042. In this way when an electric current is applied to the autofocus coil, Lorentz forces are developed due to the presence of the four magnets, and a force substantially parallel to the optical axis is generated to move the lens carrier, and hence lens, along the optical axis, relative to the support structure of the autofocus mechanism of the actuator, so as to focus the lens. In addition to suspending the lens carrier and substantially eliminating parasitic motions, the upper spring 4040 and lower spring 4042 also resist the Lorentz forces, and hence convert the forces to a displacement of the lens. This basic architecture shown in FIGS. 3-4 and is typical of some embodiments, in which optical image stabilization function includes moving the entire autofocus mechanism of the actuator (supported by the autofocus yoke) in linear directions orthogonal to the optical axis, in response to user handshake, as detected by some means, such a two or three axis gyroscope, which senses angular velocity. The handshake of interest is the changing angular tilt of the camera in 'pitch and yaw directions', which can be compensated by said linear movements of the lens relative to the image sensor.

At least some embodiments may achieve this two independent degree-of-freedom motion by using two pairs of optical image stabilization coils, each pair acting together to deliver controlled motion in one linear axis orthogonal to the optical axis, and each pair delivering controlled motion in a direction substantially orthogonal to the other pair. In at least some embodiments, these optical image stabilization coils may be fixed to the camera actuator support structure, and when current is appropriately applied, optical image stabilization coils may generate Lorentz forces on the entire autofocus mechanism of the actuator, moving it as desired. The required magnetic fields for the Lorentz forces are produced by the same four magnets that enable to the Lorentz forces for the autofocus function. However, since the directions of motion of the optical image stabilization movements are orthogonal to the autofocus movements, it is the fringing field of the four magnets that are employed, which have components of magnetic field in directions parallel to the optical axis.

Returning to FIGS. 3-4, in at least some embodiments, the suspension of the autofocus mechanism on the actuator 4000 support structure may be achieved by the use of four corner wires 4020, for example wires with a circular cross-section. Each wire 4020 acts as a flexure beams capable of bending with relatively low stiffness, thus allowing motion in both optical image stabilization degrees-of-freedom. However, wire 4020 is in some embodiments relatively stiff in directions parallel to the optical axis, as this would require the wire to stretch or buckle, thus substantially preventing parasitic motions in these directions. In addition, the presence of four such wires, appropriately separated allows them to be stiff in the parasitic tilt directions of pitch and yaw, thus substantially preventing relative dynamic tilt between the lens and image sensor. This may be seen by appreciating that each wire 4020 is stiff in directions that require it to change in length, and hence the fixed points at the ends of each wire (eight points in total) will substantially form the vertices of a parallelepiped for all operational positions of the optical image stabilization mechanism.

Figure 5:
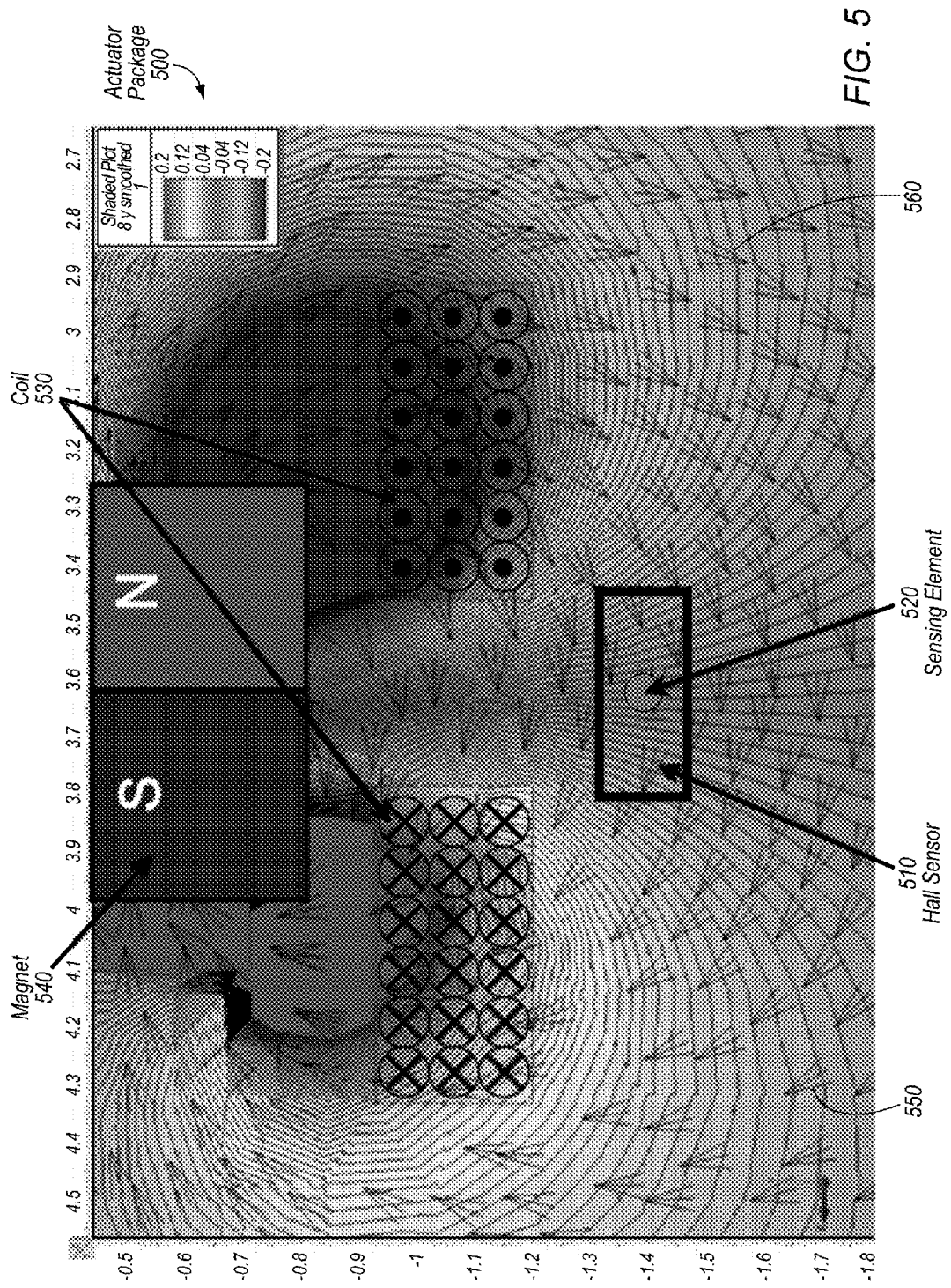
FIG. 5 illustrates a schematic view of a hall sensor, coil and magnet, according to at least some embodiments.

FIG. 5 illustrates a schematic view of a hall sensor, coil and magnet, according to at least some embodiments. An actuator package 500 includes a magnet 540 and a coil 530, as well as a hall sensor 510 with a sensing element 520. FIG. 5 shows a schematic cross-section of one part of the OIS actuator package 500. Shown is a magnet 540, which moves, with field lines showing a representation of the magnetic field 560 being produced by the magnet 540. The arrows 550 show the direction of the field 560, and shows how the field 560 curves around the magnetic from the north to the south poles. FIG. 5 also shows a cross-section of the drive coil 530, and the Hall sensor 510, both of which are fixed and do not move in some embodiments. As viewed in the orientation of FIG. 5, it is the vertical component of the magnetic field 560 that interacts with the coil 530 to generate Lorentz forces to the left or right (specifically to the right given the current direction implied by the dots and crosses in the coil cross-section).

The Hall sensor 510 is also responsive to the vertical component of the magnetic field 560, but is insensitive to the horizontal component. This means that in the hypothetical case, where the magnet 540 is centered, the Hall sensor 510 output is close to zero (in practice the Hall sensor 510 will frequently have an offset voltage). It is assumed that at the time of manufacture, an actuator package 500 will undergo a calibration stage, whereby the actuator package 510 is exercised, and its actual position is measured by an external sensor, whilst the drive current required to hold the measured position, AND the Hall sensor 510 reading are both measured, correlated with the external measure of position, and stored in a look-up table. From these values, both the VCM sensitivity and the Hall sensor 510 gain can be determined under the environmental conditions of the actual test.

Figure 6:
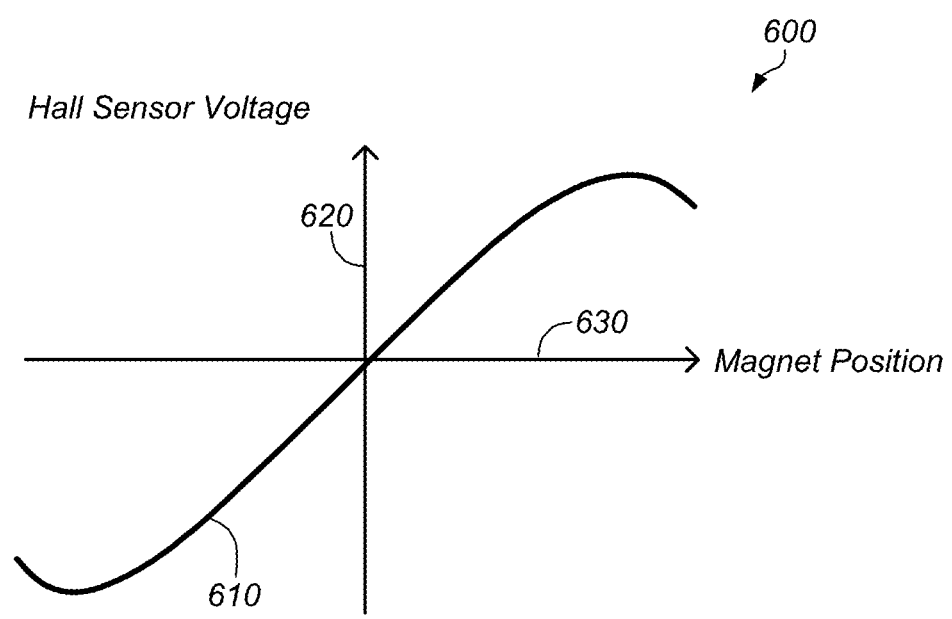
FIG. 6 depicts a plot of a relationship between hall sensor voltage and magnet position, according to at least some embodiments.

FIG. 6 depicts a plot of a relationship between hall sensor voltage and magnet position, according to at least some embodiments. Graph 600 includes a voltage-position curve 610 indicating that hall sensor voltage 620 changes as a function of magnet position 630. Note that for range of positions the Hall sensor output is approximately linear with magnet position 630.

Figure 7A:
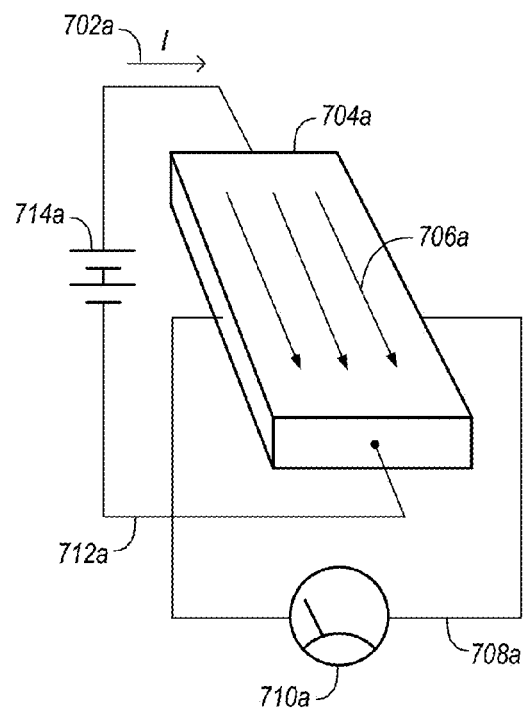
FIGS. 7A and 7B illustrate a schematic view of operation of a hall sensor, according to at least some embodiments.
Figure 7B:
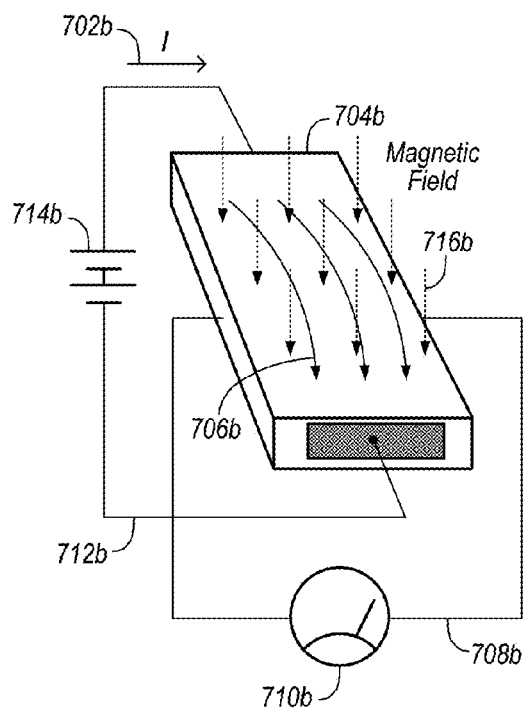

FIGS. 7A and 7B illustrate a schematic view of operation of a hall sensor, according to at least some embodiments. A Hall sensor 704a and 704b is a four-terminal semiconductor device. Two drive terminals are typically connected 712a and 712b to a current source 714a and 714b to drive constant current through the device. Two voltage sensing terminals 710a and 710b are located across the conducting channel of the semiconductor. In the presence of a magnetic field 716b with a component orthogonal to the direction of current 702a and 702b flow 706a and 706b through the Hall sensor 704a and 704b, and orthogonal to the notional line across the device linking the two sensing terminals, the moving charges drift across the conducting channel under the influence of the magnetic field 716b and hence generate a voltage across the sensing terminals 710a and 710b connected 708a and 708b to the Hall sensor 704a and 704b. Thus, the Hall sensor actually detects magnetic field 716b. This operation is schematically shown in FIG. 3.

Figure 8:
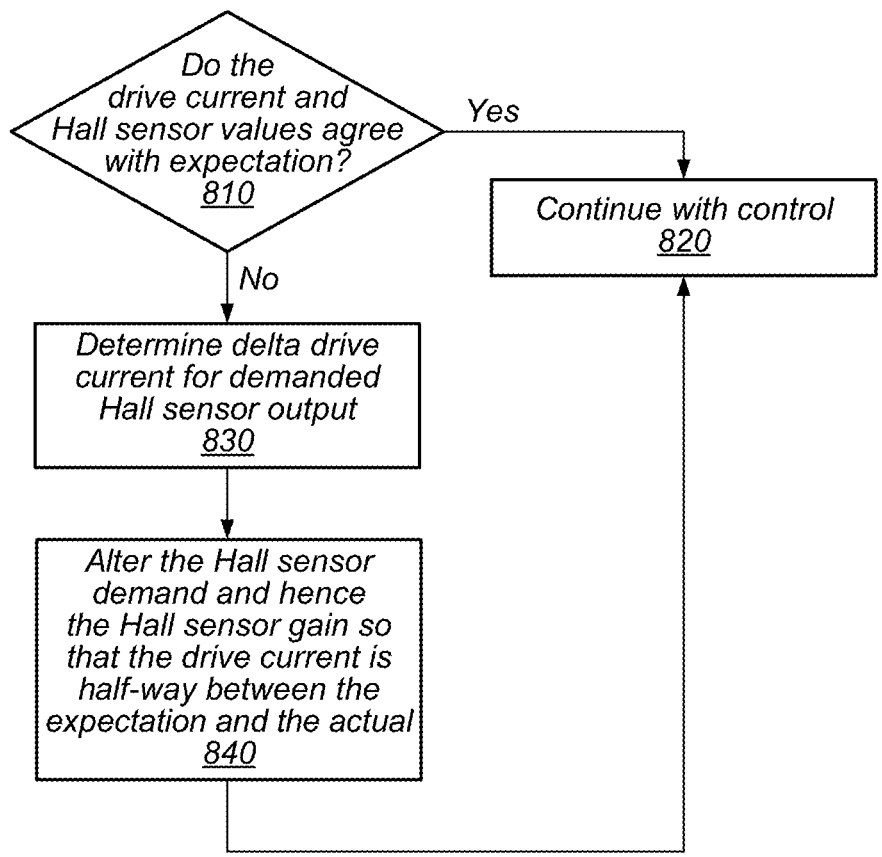
FIG. 8 is a flowchart of a method for camera component control, according to some embodiments.

FIG. 8 is a flowchart of a method for camera component control, according to some embodiments. A determination is made as to whether the drive current and Hall sensor values agree with expectations (block 810). If the drive current and Hall sensor values agree with expectations, then the process continues to block 820, and control of magnets and coils is unaltered. Returning to block 810, if the drive current and Hall sensor values do not agree with expectations, then the process moves to block 830, and a delta drive current for a demanded Hall sensor output is determined. The Hall sensor demand and hence the Hall sensor gain are then altered so that the drive current is half-way between the expected value and the actual value (block 840).

Figure 9:
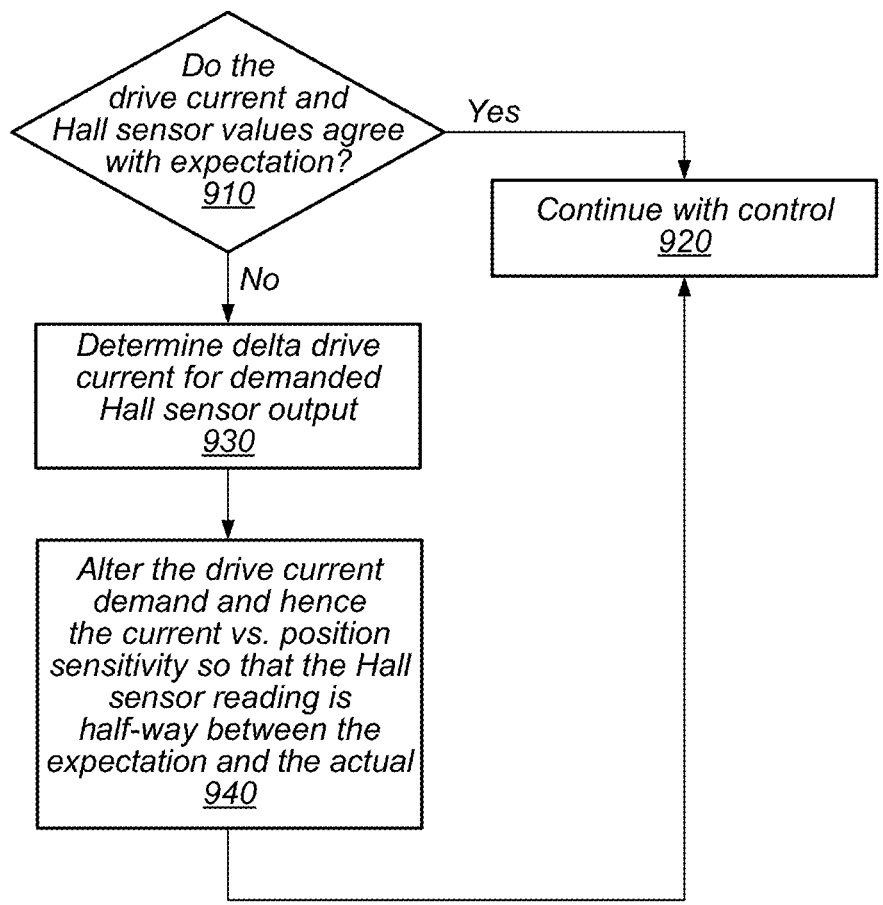
FIG. 9 is a flowchart of a method for camera component control, according to some embodiments.

FIG. 9 is a flowchart of a method for camera component control, according to some embodiments. A determination is made as to whether the drive current and Hall sensor values agree with expectations (block 910). If the drive current and Hall sensor values agree with expectations, then the process continues to block 920, and control of magnets and coils is unaltered. Returning to block 910, if the drive current and Hall sensor values do not agree with expectations, then the process moves to block 930, and a delta Hall sensor output for a demanded drive current is determined. The drive current demand and hence the current vs. position sensitivity are then altered so that the Hall sensor reading is half-way between the expected value and the actual value (block 940).

Figure 10:
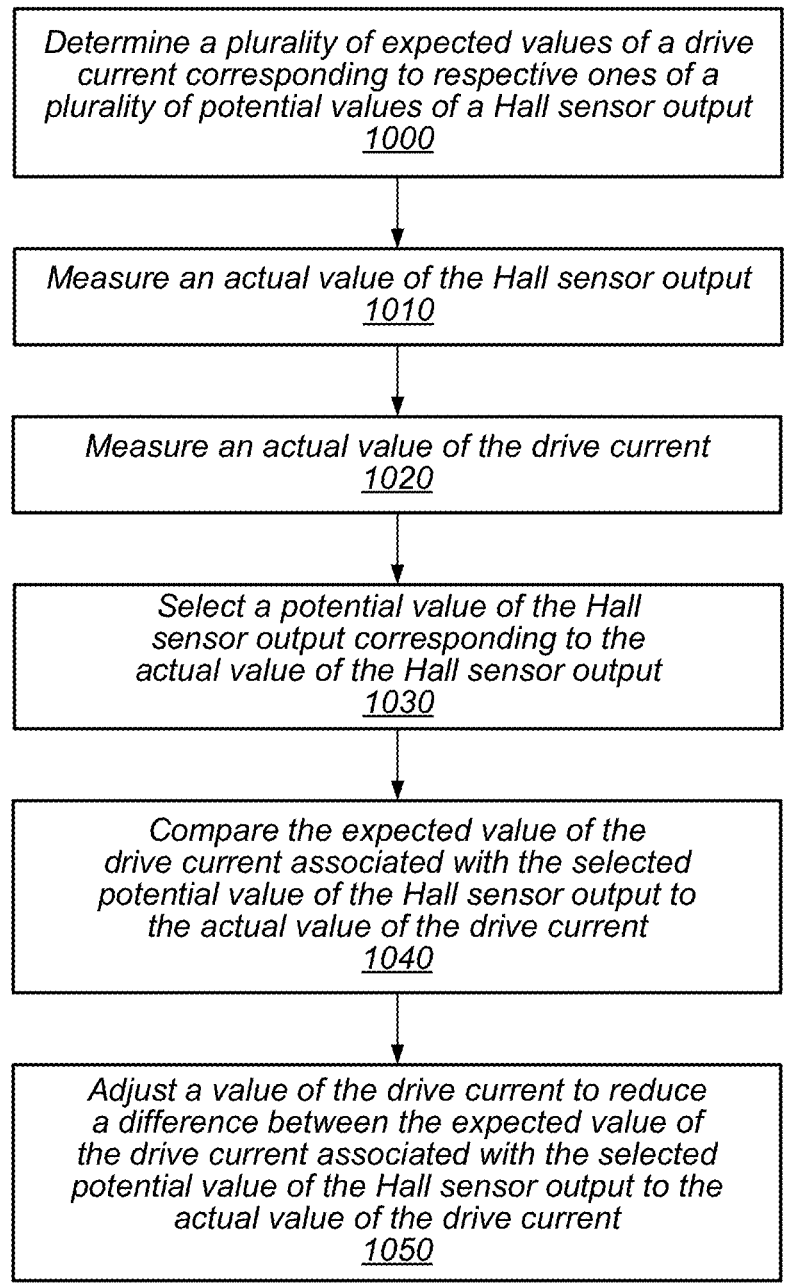
FIG. 10 is a flowchart of a method for camera component control, according to some embodiments.

FIG. 10 is a flowchart of a method for camera component control, according to some embodiments. A plurality of expected values of a drive current corresponding to respective ones of a plurality of potential values of a Hall sensor output is determined (block 1000). An actual value of the Hall sensor output is measured (block 1010). An actual value of the drive current is measured (block 1020). A potential value of the Hall sensor output corresponding to the actual value of the Hall sensor output is selected (block 1030). The expected value of the drive current associated with the selected potential value of the Hall sensor output is compared to the actual value of the drive current (block 1040). A value of the drive current is adjusted to reduce a difference between the expected value of the drive current associated with the selected potential value of the Hall sensor output to the actual value of the drive current (block 1050)

Example Computer System

Figure 11:
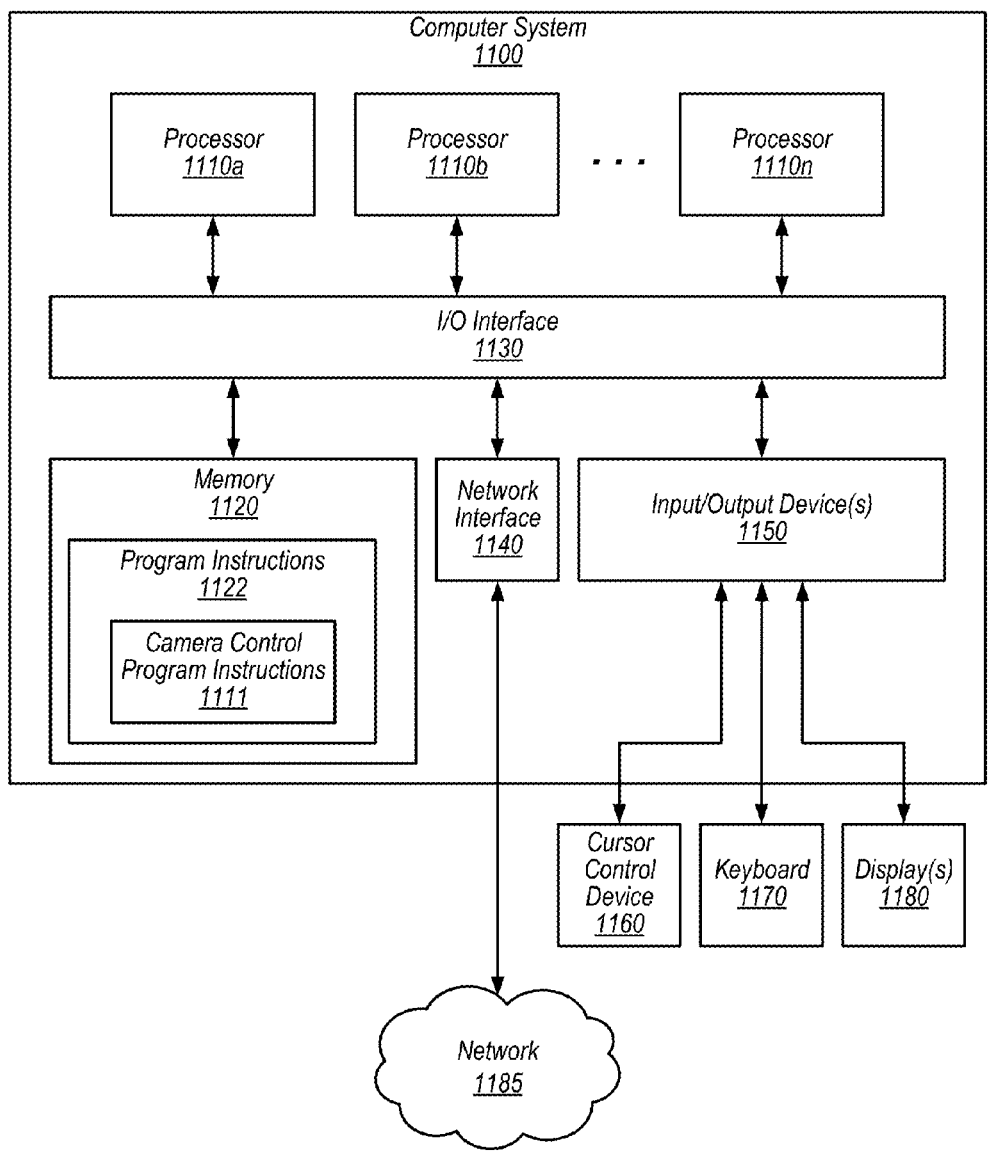
FIG. 11 illustrates an example computer system configured to implement aspects of the system and method for camera control, according to some embodiments.

FIG. 11 illustrates an example computer system 1100 that may be configured to execute any or all of the embodiments described above. In different embodiments, computer system 1100 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of temperature compensation for sensors, as described herein may be executed in one or more computer systems 1100, which may interact with various other devices. Note that any component, action, or functionality described above with respect to FIGS. 1-20 may be implemented on one or more computers configured as computer system 1100 of FIG. 30, according to various embodiments. In the illustrated embodiment, computer system 1100 includes one or more processors 1110 coupled to a system memory 1120 via an input/output (I/O) interface 1130. Computer system 1100 further includes a network interface 1140 coupled to I/O interface 1130, and one or more input/output devices 1150, such as cursor control device 1160, keyboard 1170, and display(s) 1180. In some cases, it is contemplated that embodiments may be implemented using a single instance of computer system 1100, while in other embodiments multiple such systems, or multiple nodes making up computer system 1100, may be configured to host different portions or instances of embodiments. For example, in one embodiment some elements may be implemented via one or more nodes of computer system 1100 that are distinct from those nodes implementing other elements.

In various embodiments, computer system 1100 may be a uniprocessor system including one processor 1110, or a multiprocessor system including several processors 1110 (e.g., two, four, eight, or another suitable number). Processors 1110 may be any suitable processor capable of executing instructions. For example, in various embodiments processors 1110 may be general-purpose or embedded processors implementing any of a variety of instruction set architectures (ISAs), such as the x86, PowerPC, SPARC, or MIPS ISAs, or any other suitable ISA. In multiprocessor systems, each of processors 1110 may commonly, but not necessarily, implement the same ISA.

System memory 1120 may be configured to store camera control program instructions 1122 and/or camera control data accessible by processor 1110. In various embodiments, system memory 1120 may be implemented using any suitable memory technology, such as static random access memory (SRAM), synchronous dynamic RAM (SDRAM), nonvolatile/Flash-type memory, or any other type of memory. In the illustrated embodiment, program instructions 1122 may be configured to implement a lens control application 1124 incorporating any of the functionality described above. Additionally, existing camera control data 1132 of memory 1120 may include any of the information or data structures described above. In some embodiments, program instructions and/or data may be received, sent or stored upon different types of computer-accessible media or on similar media separate from system memory 1120 or computer system 1100. While computer system 1100 is described as implementing the functionality of functional blocks of previous Figures, any of the functionality described herein may be implemented via such a computer system.

In one embodiment, I/O interface 1130 may be configured to coordinate I/O traffic between processor 1110, system memory 1120, and any peripheral devices in the device, including network interface 1140 or other peripheral interfaces, such as input/output devices 1150. In some embodiments, I/O interface 1130 may perform any necessary protocol, timing or other data transformations to convert data signals from one component (e.g., system memory 1120) into a format suitable for use by another component (e.g., processor 1110). In some embodiments, I/O interface 1130 may include support for devices attached through various types of peripheral buses, such as a variant of the Peripheral Component Interconnect (PCI) bus standard or the Universal Serial Bus (USB) standard, for example. In some embodiments, the function of I/O interface 1130 may be split into two or more separate components, such as a north bridge and a south bridge, for example. Also, in some embodiments some or all of the functionality of I/O interface 1130, such as an interface to system memory 1120, may be incorporated directly into processor 1110.

Network interface 1140 may be configured to allow data to be exchanged between computer system 1100 and other devices attached to a network 1185 (e.g., carrier or agent devices) or between nodes of computer system 1100. Network 1185 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1140 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1150 may, in some embodiments, include one or more display terminals, keyboards, keypads, touchpads, scanning devices, voice or optical recognition devices, or any other devices suitable for entering or accessing data by one or more computer systems 1100. Multiple input/output devices 1150 may be present in computer system 1100 or may be distributed on various nodes of computer system 1100. In some embodiments, similar input/output devices may be separate from computer system 1100 and may interact with one or more nodes of computer system 1100 through a wired or wireless connection, such as over network interface 1140.

As shown in FIG. 11, memory 1120 may include program instructions 1122, which may be processor-executable to implement any element or action described above. In one embodiment, the program instructions may implement the methods described above. In other embodiments, different elements and data may be included. Note that data may include any data or information described above.

Those skilled in the art will appreciate that computer system 1100 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1100 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1100 may be transmitted to computer system 1100 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A method, the method comprising:
   determining a plurality of expected values of a drive current corresponding to respective ones of a plurality of potential values of a Hall sensor output;
   measuring an actual value of the Hall sensor output;
   measuring an actual value of the drive current;
   selecting a potential value of the Hall sensor output corresponding to the actual value of the Hall sensor output;
   comparing the expected value of the drive current associated with the selected potential value of the Hall sensor output to the actual value of the drive current; and
   adjusting a value of the drive current to reduce a difference between the expected value of the drive current associated with the selected potential value of the Hall sensor output to the actual value of the drive current.

2. The method of claim 1, wherein
   determining a plurality of expected values of a drive current corresponding to respective ones of a plurality of potential values of a Hall sensor output further comprises:
   performing a factory calibration that includes characterization at only one temperature of an open loop sensitivity of a voice coil motor actuator and the Hall sensor output for plural positions of the voice coil motor actuator.

3. The method of claim 1, wherein
   adjusting a value of the drive current to reduce a difference between the expected value of the drive current associated with the selected potential value of the Hall sensor output to the actual value of the drive current further comprises:
   adjusting a value of the drive current based on the plurality of expected values of the drive current to halve a difference between the expected value of the drive current associated with the selected potential value of the Hall sensor output to the actual value of the drive current.

4. The method of claim 1, wherein
   determining a plurality of expected values of a drive current corresponding to respective ones of a plurality of potential values of a Hall sensor output further comprises:
   characterizing an open loop sensitivity of a voice coil motor actuator and the Hall sensor output for plural positions of the voice coil motor actuator.

5. The method of claim 1, wherein
   adjusting a value of the drive current to reduce a difference between the expected value of the drive current associated with the selected potential value of the Hall sensor output to the actual value of the drive current further comprises:
   adjusting a value of the drive current based at least in part on the plurality of expected values of the drive current.

6. The method of claim 1, wherein
   adjusting a value of the drive current to reduce a difference between the expected value of the drive current associated with the selected potential value of the Hall sensor output to the actual value of the drive current further comprises:
   providing temperature compensation by adjusting a value of the drive current in an actuator providing optical image stabilization based at least in part on the plurality of expected values of the drive current.

7. The method of claim 1, wherein
   adjusting a value of the drive current to reduce a difference between the expected value of the drive current associated with the selected potential value of the Hall sensor output to the actual value of the drive current further comprises:
   adjusting a value of the drive current based at least in part on the plurality of expected values of the drive current.

8. A non-transitory computer-readable storage medium storing program instructions, wherein the program instructions are computer-executable to implement:
   determining a plurality of expected values of a drive current corresponding to respective ones of a plurality of potential values of a Hall sensor output;
   measuring an actual value of the Hall sensor output;
   measuring an actual value of the drive current;
   selecting a potential value of the Hall sensor output corresponding to the actual value of the Hall sensor output;

comparing the expected value of the drive current associated with the selected potential value of the Hall sensor output to the actual value of the drive current; and adjusting a value of the drive current to reduce a difference between the expected value of the drive current associated with the selected potential value of the Hall sensor output to the actual value of the drive current.

9. The non-transitory computer-readable storage medium of claim 8, wherein the program instructions computer-executable to implement determining a plurality of expected values of a drive current corresponding to respective ones of a plurality of potential values of a Hall sensor output further comprise:

program instructions computer-executable to implement performing a factory calibration that includes characterization at only one temperature of an open loop sensitivity of a voice coil motor actuator and the Hall sensor output for plural positions of the voice coil motor actuator.

10. The non-transitory computer-readable storage medium of claim 8, wherein

The program instructions computer-executable to implement adjusting a value of the drive current to reduce a difference between the expected value of the drive current associated with the selected potential value of the Hall sensor output to the actual value of the drive current further comprise:

program instructions computer-executable to implement adjusting a value of the drive current based on the plurality of expected values of the drive current to halve a difference between the expected value of the drive current associated with the selected potential value of the Hall sensor output to the actual value of the drive current.

11. The non-transitory computer-readable storage medium of claim 8, wherein the program instructions computer-executable to implement determining a plurality of expected values of a drive current corresponding to respective ones of a plurality of potential values of a Hall sensor output further comprise:

program instructions computer-executable to implement characterizing an open loop sensitivity of a voice coil motor actuator and the Hall sensor output for plural positions of the voice coil motor actuator.

12. The non-transitory computer-readable storage medium of claim 8, wherein the program instructions computer-executable to implement adjusting a value of the drive current to reduce a difference between the expected value of the drive current associated with the selected potential value of the Hall sensor output to the actual value of the drive current further comprise:

program instructions computer-executable to implement adjusting a value of the drive current based at least in part on the plurality of expected values of the drive current.

13. The non-transitory computer-readable storage medium of claim 8, wherein the program instructions computer-executable to implement adjusting a value of the drive current to reduce a difference between the expected value of the drive current associated with the selected potential value of the Hall sensor output to the actual value of the drive current further comprise:

program instructions computer-executable to implement providing temperature compensation by adjusting a value of the drive current in an actuator providing optical image stabilization based at least in part on the plurality of expected values of the drive current.

14. The non-transitory computer-readable storage medium of claim 8, wherein the program instructions computer-executable to implement adjusting a value of the drive current to reduce a difference between the expected value of the drive current associated with the selected potential value of the Hall sensor output to the actual value of the drive current further comprise:

program instructions computer-executable to implement adjusting a value of the drive current based at least in part on the plurality of expected values of the drive current.

15. An apparatus for controlling the motion of a camera component, the apparatus comprising:

an actuator module comprising a plurality of magnets;

sensors for measuring a magnetic field;

one or more processors; and one or more memories storing instructions executable on the one or more processors to perform:

determining a plurality of expected values of a drive current corresponding to respective ones of a plurality of potential values of a Hall sensor output, measuring an actual value of the Hall sensor output, measuring an actual value of the drive current, selecting a potential value of the Hall sensor output corresponding to the actual value of the Hall sensor output, comparing the expected value of the drive current associated with the selected potential value of the Hall sensor output to the actual value of the drive current, and adjusting a value of the drive current to reduce a difference between the expected value of the drive current associated with the selected potential value of the Hall sensor output to the actual value of the drive current.

16. The apparatus of claim 15, wherein the instructions executable on the one or more processors to perform determining a plurality of expected values of a drive current corresponding to respective ones of a plurality of potential values of a Hall sensor output further comprise instructions executable on the one or more processors to perform:

performing a factory calibration that includes characterization at only one temperature of an open loop sensitivity of a voice coil motor actuator and the Hall sensor output for plural positions of the voice coil motor actuator.

17. The apparatus of claim 15, wherein the instructions executable on the one or more processors to perform adjusting a value of the drive current to reduce a difference between the expected value of the drive current associated with the selected potential value of the Hall sensor output to the actual value of the drive current further comprise instructions executable on the one or more processors to perform:

adjusting a value of the drive current based on the plurality of expected values of the drive current to halve a difference between the expected value of the drive current associated with the selected potential value of the Hall sensor output to the actual value of the drive current.

18. The apparatus of claim 15, wherein
the instructions executable on the one or more processors to perform determining a plurality of expected values of a drive current corresponding to respective ones of a plurality of potential values of a Hall sensor output further comprise:
  instructions executable on the one or more processors to perform characterizing an open loop sensitivity of a voice coil motor actuator and the Hall sensor output for plural positions of the voice coil motor actuator.

19. The apparatus of claim 15, wherein
the instructions executable on the one or more processors to perform adjusting a value of the drive current to reduce a difference between the expected value of the drive current associated with the selected potential value of the Hall sensor output to the actual value of the drive current further comprise instructions executable on the one or more processors to perform:
  adjusting a value of the drive current based at least in part on the plurality of expected values of the drive current.

20. The apparatus of claim 15, wherein
the instructions executable on the one or more processors to perform adjusting a value of the drive current to reduce a difference between the expected value of the drive current associated with the selected potential value of the Hall sensor output to the actual value of the drive current further comprise instructions executable on the one or more processors to perform:
  providing temperature compensation by adjusting a value of the drive current in an actuator providing optical image stabilization based at least in part on the plurality of expected values of the drive current.

* * * * *